(12) United States Patent
Tang

(10) Patent No.: US 6,207,516 B1
(45) Date of Patent: Mar. 27, 2001

(54) METHOD OF FABRICATING GATE OXIDE LAYER WITH DIFFERENT THICKNESS

(75) Inventor: Tien-Hao Tang, Chungho (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/215,033

(22) Filed: Dec. 17, 1998

(51) Int. Cl.$^7$ .......................... H01L 21/336; H01L 21/31
(52) U.S. Cl. ............................ 438/301; 438/306; 438/761
(58) Field of Search ................................... 438/761, 301, 438/306

(56) References Cited

U.S. PATENT DOCUMENTS

| | | | |
|---|---|---|---|
| 4,682,404 | * | 7/1987 | Miller et al. . |
| 5,681,768 | * | 10/1997 | Smayling et al. . |
| 5,923,982 | * | 7/1999 | Kadosh et al. . |
| 5,970,347 | * | 10/1999 | Gardner et al. . |

* cited by examiner

Primary Examiner—John F. Niebling
Assistant Examiner—Josetta Jones
(74) Attorney, Agent, or Firm—Thomas, Kayden, Horstemeyer, Risley

(57) ABSTRACT

A method of fabricating a gate oxide layer of different thickness. A substrate having a gate oxide layer and a gate is provided and a portion of the gate oxide layer is removed. A first thermal oxide layer is formed to cover the surface of the substrate and the gate and a masking layer is formed to cover the first thermal oxide layer. The masking layer is defined and a portion of the thermal oxide layer is removed to expose a portion of the surface of the gate and the substrate. A first implantation is performed and a drain region is formed at the side of the gate. A second thermal oxide layer is then formed to cover the exposing substrate and the exposing gate. The masking layer is removed and the second thermal oxide layer and the first thermal oxide layer are etched back to expose the surface of the gate and the second thermal oxide layer becomes a spacer structure. A second implantation is performed and a source region is then formed at the other side of the gate; the dopant concentration in the drain region adjacent to the gate is lighter.

10 Claims, 2 Drawing Sheets

METHOD OF FABRICATING GATE OXIDE LAYER WITH DIFFERENT THICKNESS

BACKGROUND OF THE INVENTION

1. Field of the Invention

The invention relates to a method of fabricating gate oxide layer with different thicknesses, and more particularly to a method of fabricating gate oxide layer with different thicknesses, which can provide improved protection against electrostatic discharge (ESD).

2. Description of the Related Art

As the size of semiconductor technology becomes smaller and smaller, the length of the channel becomes shorter. When the length of the channel becomes small, the across-electric field in the channel increases if the voltage applied on the gate doesn't change. The energy of the electrons in the channel increases because the electric field increases and the energy of the electrons is higher, especially adjacent to the channel and the drain region. The energy of the electrons is higher than the other electrons that are in thermal equilibrium, so the electrons are called hot electrons. The phenomenon is called the hot electron effect and it is also called the hot carrier effect. The hot electron effect affects the operation of the MOS transistor because the channel length has shortened.

One method of solving the hot electron effect of short channel length, for example, is to decrease the operation voltage of MOS transistor. Another method used is to construct a lightly doped drain (LDD). In the lightly doped drain method a doped region is formed near the original MOS source/drain region, adjacent to the channel, and the dosage of the LDD is lighter than the original source/drain region.

The capacity of electrostatic-discharge protection is affected by using the LDD structure. Static voltage can be produced by walking across a room or by removing an integrated circuit from its plastic package. If such a high voltage is accidentally applied to the pins of an IC package, its discharge can cause breakdown of the gate oxide of the devices to which it is applied. The breakdown event may cause sufficient damage to produce immediate destruction of the devices, or it may weaken the oxide enough that it will fail early in the operating life of the device.

Therefore, all pins of MOS integrated circuits must be provided with protection circuits to prevent such voltages from damaging the MOS gates. These protective circuits, normally placed between the input and output pads on a chip and the transistor gates to which the pads are connected, are designed to begin conducting or to undergo breakdown, thereby providing an electrical path to a ground. Since the breakdown mechanism is designed to be nondestructive, the circuits provide a normally open path that closes only when a high voltage appears at the input or output terminals.

SUMMARY OF THE INVENTION

It is therefore an object of the invention to provide a method of forming a thicker oxide layer near the MOS gate and the drain region. This reduces the intensity of the electric field in the channel and also decreases the hot electron effect. The undesirable LDD process is then unnecessary and protection against electrostatic discharge can be improved.

To achieve these objects and advantages, and in accordance with the purpose of the invention, as embodied and broadly described herein, the invention is directed towards a method of fabricating a gate oxide layer with different thickness. A substrate having a gate oxide layer and a gate is provided and a portion of the gate oxide layer is removed. A first thermal oxide layer is formed to cover the surface of the substrate and the gate and a masking layer is formed to cover the first thermal oxide layer. The masking layer is defined and a portion of the thermal oxide layer is removed to expose a portion of the surface of the gate and the substrate. A first implantation is performed to form a drain region at one side of the gate. A second thermal oxide layer is then formed to cover the exposing substrate and the exposing gate. The masking layer is removed and the second thermal oxide layer and the first thermal oxide layer are etched back to expose the surface of the gate so the second thermal oxide layer becomes a spacer structure. A second implantation is performed to form a source region at the other side of the gate. The concentration of dopant ions in the drain region adjacent to the gate is lighter.

It is to be understood that both the foregoing general description and the following detailed description are exemplary and explanatory only and are not restrictive of the invention, as claimed.

DESCRIPTION OF THE PREFERRED EMBODIMENTS

Figure 1A:
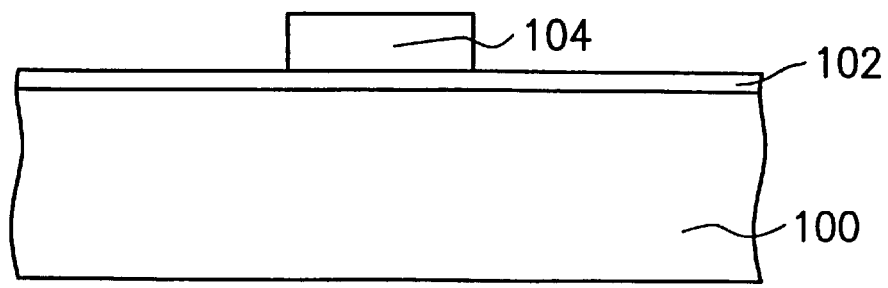
FIG. 1A to FIG. 1F show the cross sectional views of the process of fabricating a gate oxide layer with different thickness.

Referring to FIG. 1A, a P-type substrate 100 is provided and a gate oxide layer 102 with a thickness of about 50 Å is formed on the substrate by thermal oxidation. A polysilicon layer 104 with an N type dopant is deposited and defined to form a gate of MOS transistor.

Figure 1B:
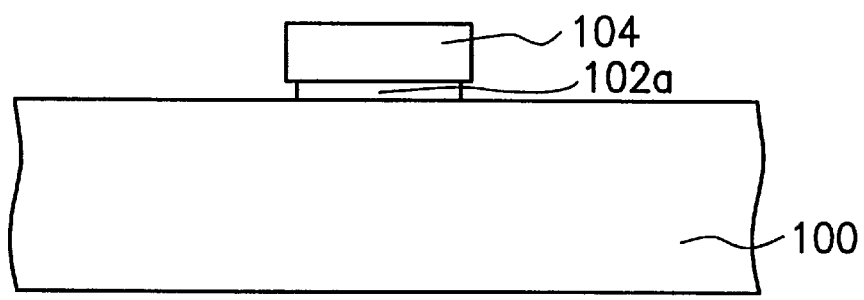
Figure 1C:
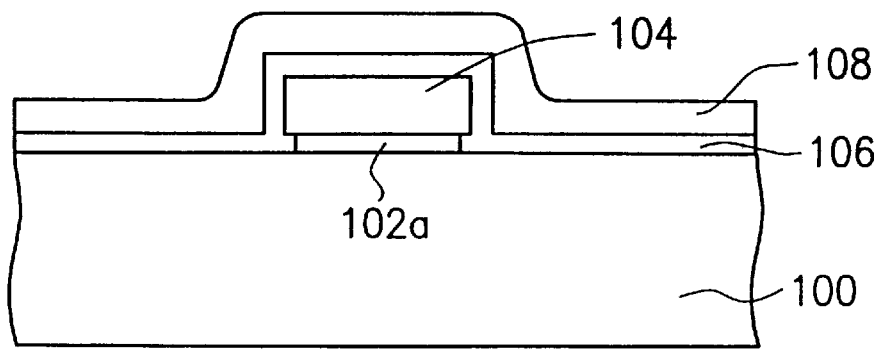

Next, as shown in FIG. 1B, a portion of gate oxide layer 102 is removed by isotropic etching using HF as an etchant and the surface of substrate 100 which isn't covered with the polysilicon layer 104 is exposed. In Figure C, the substrate 100 is heated by thermal oxidation and a first thermal oxide layer 106 is formed on the surface of the polysilicon layer 104 and the substrate 100, to a thickness of about 100–200 Å. A masking layer 108 is then formed on the first thermal oxide layer 106; for example, a silicon nitride layer is deposited by chemical vapor deposition (CVD), to a thickness of about 1000–2000 Å.

Figure 1D:
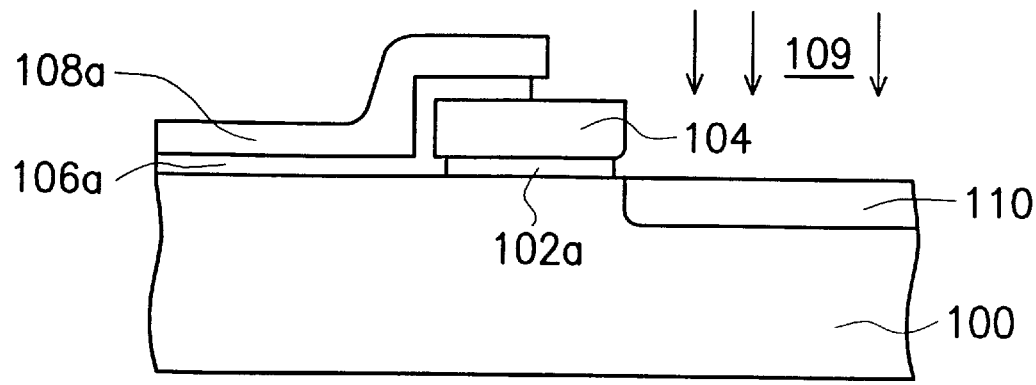

Referring to FIG. 1D, the masking layer 108a is patterned by photolithography. A portion of the first thermal oxide layer 106a and the gate oxide layer 102a are removed isotropically by wet etching using HF as an etchant and the surface of the substrate 100 adjacent to the gate 104 is exposed. A first implantation 109 using, for example, N-type ions, is performed to the substrate 100 and a drain region 110 is thus formed on the substrate 100.

Figure 1E:
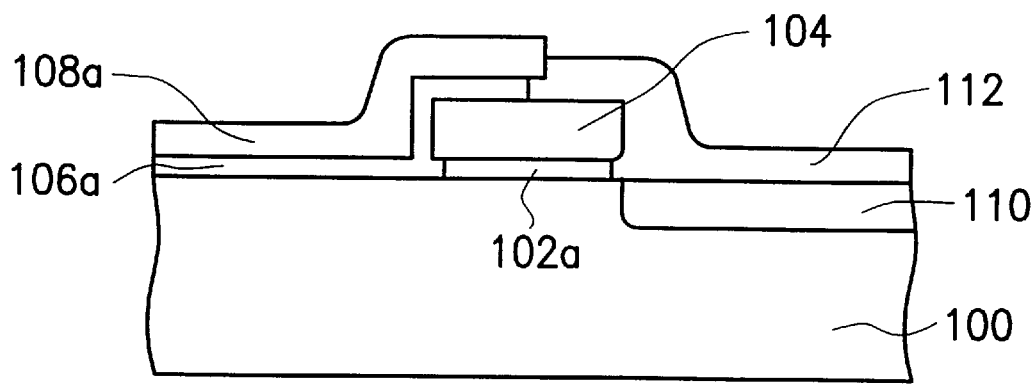
Figure 1F:
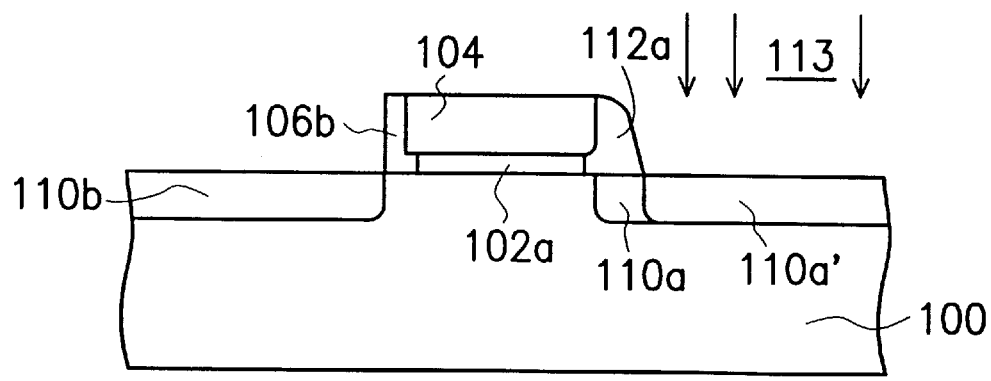

Referring to FIG. 1E, a second thermal oxide layer 112 is formed on the exposed surface of the substrate 100 by thermal oxidation. The surface of the substrate 100 adjacent to the gate 104 and a portion of gate 104 are covered with the thermal oxide layer 112. As shown in FIG. 1F, the masking layer 108a is next removed and the second thermal oxide layer 112 and the first thermal oxide layer 106a are etched anisotropically to expose the surface of the substrate 100 and the gate 104. The second thermal oxide layer 112 on the drain region 110 becomes a spacer structure 112a and there is still a portion of the first thermal oxide layer 106b left on the other side of the gate 104. A second implantation 113 is performed and the source region 110a of the gate 104 is then formed at the other side of the gate 104. A drain region 110*a*, 110*a'* with different doped concentration is also formed and the doped concentration of the drain region adjacent to the gate 104 is lighter. The chances of electrons from the gate 104 passing through the spacer 112*a* to the drain region 110*a* decreases and the reliability of devices can be improved. Annealing is performed to activate the dopant of the source/drain region 110*a*, 110*a'*.

The major structure of this invention includes the gate 104 and the gate oxide layer 102*a* on the substrate 100, which further comprises the drain region 110 and the source region 110*a*. In addition, the spacer structure 112*a* that is formed from the second thermal oxide layer is used as a gate oxide layer on the drain region 100*a*. A portion of the first oxide layer 106*b* is used as a gate oxide layer on the source region 110*b*.

Because the spacer structure as a gate oxide layer is formed on the drain region near the gate, a thicker oxide layer is therefore provided. The electric field in the channel region decreases to degrade the hot carrier effect. The LDD structure is undesirable so the capacity of electrostatic protection can be improved and the reliability of device operation is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a gate oxide layer with different thickness, wherein a gate oxide layer and a gate are provided on a substrate, comprising:

removing a portion of the gate oxide layer;

forming a first thermal oxide layer to cover the surface of the substrate and the gate;

forming a masking layer to cover the first thermal oxide layer;

defining the masking layer and removing a portion of the first thermal oxide layer to expose a portion of the surface of the gate and the substrate;

forming a drain region at one side of the gate on the substrate by performing a first implantation;

forming a second thermal oxide layer to cover the exposed substrate and the gate;

removing the masking layer and etching back the second thermal oxide layer and the first thermal oxide layer, the surface of the gate is exposed, the first thermal oxide layer becomes a first spacer structure adjacent to a subsequently formed source region and the second thermal oxide layer becomes a spacer structure adjacent to the drain region; and forming a source region at the other side of the gate by performing a second implantation, wherein a doped concentration of the drain region adjacent to the gate and beneath the second spacer is lighter.

2. The method according to claim 1, wherein removing a portion of the gate oxide layer is performed by isotropic etching method.

3. The method according to claim 1, wherein removing a portion of the gate oxide layer is performed by HF solution.

4. The method according to claim 1, wherein the thickness of the thermal oxide layer is in a range of about 100–200 Å.

5. The method according to claim 1, wherein the masking layer includes a silicon nitride layer.

6. The method according to claim 5, wherein the silicon nitride layer is formed by deposition.

7. The method according to claim 5, wherein the thickness of the silicon nitride layer is in a range of about 1000–2000 Å.

8. The method according to claim 1, wherein removing a portion of the first thermal oxide layer is performed by isotropic etching method.

9. The method according to claim 1, wherein removing a portion of the first thermal oxide layer is performed using an HF solution.

10. The method according to claim 1, wherein after the step of performing the second implantation further includes a step of annealing.

* * * * *